(12) United States Patent
Lin et al.

(10) Patent No.: US 9,947,563 B2
(45) Date of Patent: Apr. 17, 2018

(54) WAFER CONTAINER WITH AIR-TIGHT DEVICE

(71) Applicant: Gudeng Precision Industrial Co., LTD., New Taipei (TW)

(72) Inventors: Chih-Ming Lin, New Taipei (TW); Chen-Hao Chang, New Taipei (TW); Jui-Ken Kao, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 379 days.

(21) Appl. No.: 14/645,648

(22) Filed: Mar. 12, 2015

(65) Prior Publication Data

US 2015/0262853 A1   Sep. 17, 2015

(30) Foreign Application Priority Data

Mar. 14, 2014 (TW) .............................. 103204455 U

(51) Int. Cl.
*B65D 85/00* (2006.01)
*H01L 21/673* (2006.01)

(52) U.S. Cl.
CPC .............................. *H01L 21/67376* (2013.01)

(58) Field of Classification Search
CPC ............................................... H01L 21/67376
USPC ....... 206/701, 710, 711, 723, 449, 454, 832, 206/833
See application file for complete search history.

(56) References Cited

U.S. PATENT DOCUMENTS

| | | | | |
|---|---|---|---|---|
| 5,024,329 A | * | 6/1991 | Grohrock | H01L 21/67376 141/98 |
| 5,575,394 A | * | 11/1996 | Nyseth | H01L 21/67373 206/454 |
| 7,344,031 B2 | * | 3/2008 | Hasegawa | H01L 21/67369 206/454 |
| 7,648,041 B2 | * | 1/2010 | Ueda | H01L 21/67126 206/710 |
| 7,866,480 B2 | * | 1/2011 | Burns | H01L 21/67369 206/711 |
| 2009/0272743 A1 | * | 11/2009 | Meulen | H01L 21/67373 220/230 |
| 2010/0190343 A1 | * | 7/2010 | Aggarwal | C30B 25/16 438/694 |
| 2013/0299384 A1 | * | 11/2013 | Fuller | H01L 21/67386 206/711 |
| 2013/0319907 A1 | * | 12/2013 | Gregerson | H01L 21/67369 206/711 |
| 2015/0122699 A1 | * | 5/2015 | Gregerson | H01L 21/67376 206/711 |

(Continued)

*Primary Examiner* — Jacob K Ackun
*Assistant Examiner* — Jenine Pagan
(74) *Attorney, Agent, or Firm* — The PL Law Group, PLLC

(57) ABSTRACT

A wafer container is provided. The wafer container includes a housing, a door and an air-tight device. The housing has a room with an opening formed therein, and a door frame surrounding the opening. The door fits in the door frame to close the opening. The air-tight device is disposed around the door, located between the door and the door frame, and having a protruding part extending toward the room. The protruding part has an early-stage pressure-adjusting element configured to exhaust a first gas from the room by pumping a second gas into the room when the door is closed.

16 Claims, 10 Drawing Sheets

(56) References Cited

U.S. PATENT DOCUMENTS

2015/0214084 A1\* 7/2015 Schneider ......... H01L 21/67161
 206/711
2015/0262853 A1\* 9/2015 Lin ................... H01L 21/67376
 206/213.1

\* cited by examiner

WAFER CONTAINER WITH AIR-TIGHT DEVICE

CROSS-REFERENCE TO RELATED APPLICATION AND CLAIM OF PRIORITY

This application claims the benefit of Taiwan Patent Application No. 103204455, filed on Mar. 14, 2014, in the Taiwan Intellectual Property Office, the disclosure of which is incorporated herein in its entirety by reference.

FIELD OF THE INVENTION

The present invention relates to a wafer container and air-tight device thereof. Particularly, the present invention relates to a wafer container being able to expedite the opening and purging process with an air-tight device thereof.

BACKGROUND OF THE INVENTION

In semiconductor production, the Standard Mechanical Interface (SMIF) is a typical handling system to assure wafers or photomasks are contained in a low-particle environment where contamination has little chance to occur, since wafers under production are vulnerable to airborne particles, particularly in nanoscale copper processes. Thus, SMIF pods are commonly used in the production line for carrying wafers. In addition, the Front Opening Unified Pod (FOUP) is a standard container for handling large wafers—300 mm or 450 mm in diameter, for example. Both SMIF pods and FOUP containers provide high level of clean-room environment to the wafers or photomasks, avoiding potential damage due to particle contamination during handling and storage.

According to current practice, clean gas such as pure nitrogen or clean dry air (CDA) is purged into wafer or photomask containers to maintain cleanliness, while humidity change inside the containers is considered an indicator for the cleanliness inside the containers. To maintain the cleanliness inside the SMIF pods and FOUP containers, there is a need to enhance the air-tight effect of the containers on the one hand, and to reduce the processing time for purging the container on the other hand. However, the purging process for traditional FOUP containers takes time, since there are only limited number of air-exhausting elements disposed on the housing of each FOUP container, and there is no other exit for the gas inside the containers to be exhausted. When the FOUP door is to be opened, it takes time and efforts to move the door off the FOUP container under air-tight condition, since the air-tight element disposed on the door retards the process of pressure balance inside and outside the container.

In order to overcome these drawbacks in the prior art, a novel design of containers for carrying wafers or photomasks is provided. The novel design of the present invention not only solves the problems described above, but also is easy to implement. Thus, the present invention has the utility for the industry.

SUMMARY OF THE INVENTION

The present invention provides a concept for a wafer or photomask container with an air-tight device, which expedites the adjustment of air pressure as well as the purging process when the container encounters a pressure-change condition, with the aid of one or more early-stage pressure-adjusting elements.

In accordance with one aspect of the present invention, a wafer container is provided. The wafer container includes a housing, a door and an air-tight device. The housing has a room with an opening formed therein, and a door frame surrounding the opening. The door fits in the door frame to close the opening. The air-tight device is disposed around the door, located between the door and the door frame, and having a protruding part extending toward the room. The protruding part has an early-stage pressure-adjusting element configured to exhaust a first gas from the room by pumping a second gas into the room when the door is closed.

In accordance with another aspect of the present invention, a wafer container is provided. The wafer container comprises a door frame, a door, an air-tight device and an early-stage pressure-adjusting element. The door is fitted in the door frame. The air-tight device is disposed between the door and the door frame. The early-stage pressure-adjusting element is disposed on the air-tight device for pre-adjusting pressure inside the wafer container.

In accordance with yet another aspect of the present invention, a method for operating a wafer container having a door frame and a door fitting in the door frame is provided. The method comprises steps of: providing an early-stage pressure-adjusting element disposed on an air-tight device located between the door and the doorframe; and exhausting a first gas from the wafer container via the early-stage pressure-adjusting element.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise forms disclosed.

The present invention is hereinafter introduced with the FOUP by way of example. It should be understood that the present invention is also applicable to any wafer or photomask container with an air-tight requirement.

Figure 1:
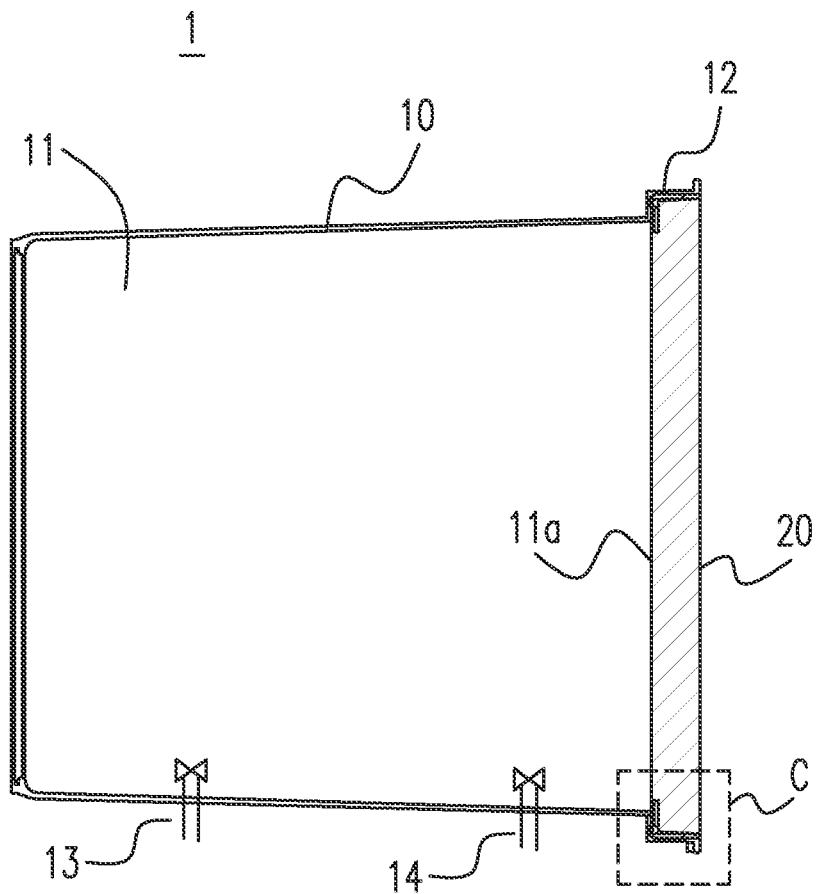
FIG. 1 shows a schematic diagram of a cross section of a wafer container according to one embodiment of the present invention.

Please refer to FIG. 1, which is a schematic diagram of a cross section of a wafer container 1 according to one embodiment of the present invention. According to FIG. 1, the wafer container 1 includes a housing 10 and a door 20. The housing 10 has a room 11 with an opening 11a formed therein, and also has a door frame 12 surrounding the opening 11a. The door 20 fits in the door frame 12 to close the opening 11a. The room 11 can be used for accommodating a plurality of wafers (not shown), and the door 20 is designed to allow wafers or photomasks to pass through.

In FIG. 1, the wafer container 1 further includes at least a pumping valve 13 and an exhaust valve 14, both disposed on the housing 10. The exhaust valve 14 is configured to exhaust a first gas from the room. The pumping valve 13 is configured to pump a second gas, such as nitrogen, inert gas or clean dry air (CDA), into the room.

Figure 2:
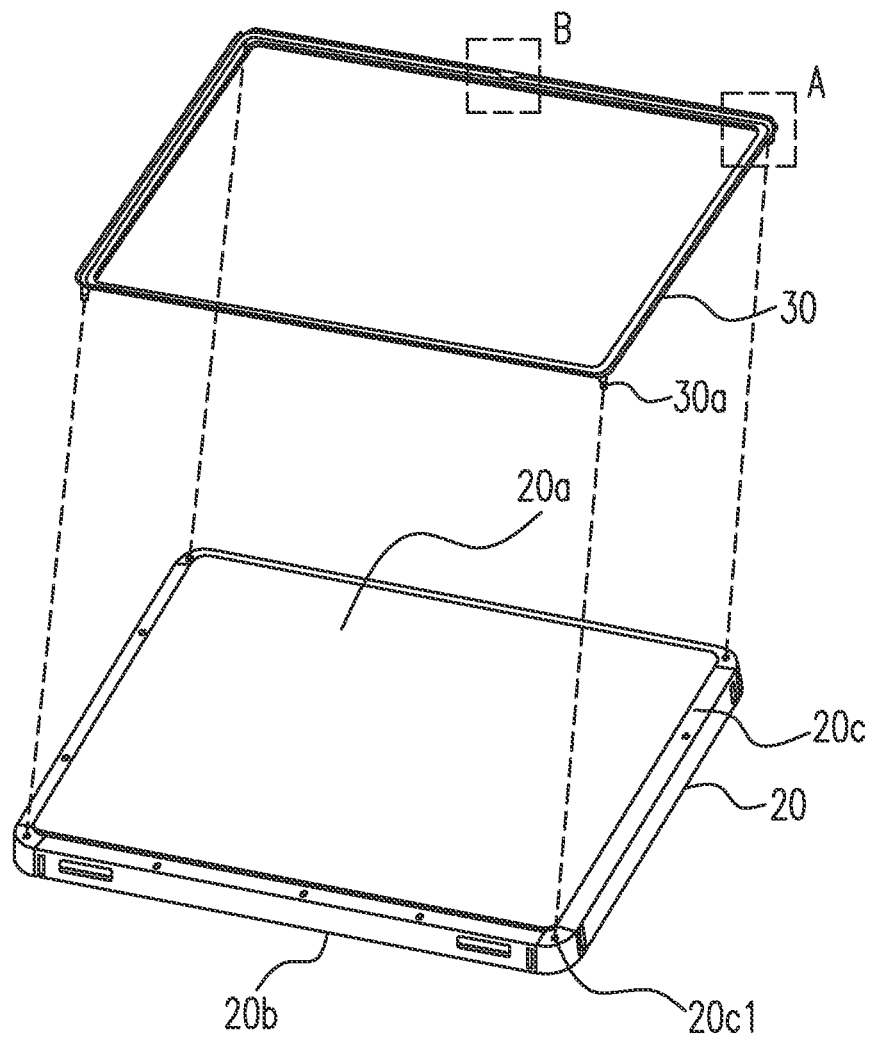
FIG. 2 shows a schematic diagram of a door and an air-tight device according to the same embodiment of the present invention.

Please refer to FIG. 2, which is a schematic diagram showing the door 20 and an air-tight device 30 according to the same embodiment of the present invention. The air-tight device 30 is disposed around the door 20. According to FIG. 2, the door 20 has an inward surface 20a facing the room 11 and an outward surface 20b opposite the inward surface 20a. The inward surface 20a has a brim 20c where the air-tight device 30 is disposed thereon. For example, holes 20c1 are located on the brim 20c for fastening elements 30a of the air-tight device 30 to secure the air-tight device 30 around the door 20. The air-tight device 30 is located between the door 20 and the door frame 12 when the door 20 is closed. The air-tight device 30 can be made of elastic materials such as polyamide, styrene, polyolefin, polyurethane or rubber, which helps fill any gap between the door 20 and the door frame 12 when the door 20 is closed, so as to achieve the air-tight effect.

Figure 3:
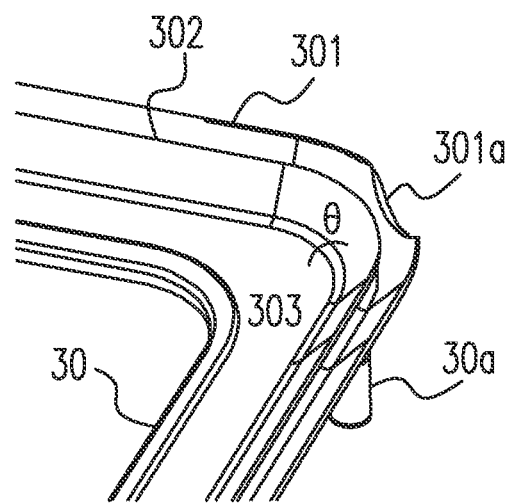
FIG. 3 shows an enlargement of portion A of the air-tight device in FIG. 2.

Please refer to FIG. 3, which is a schematic diagram showing an enlargement of portion A of the air-tight device 30 in FIG. 2. In FIG. 3, the air-tight device 30 includes a first protruding portion 301, a second protruding portion 302 and a main body 303. Notably, the first and second protruding portions 301, 302 together can be viewed as a protruding part of the air-tight device 30. The first protruding portion 301 is disposed outer relative to the second protruding portion 302, and the two protruding portions 301, 302 are separate. The first and the second protruding portions 301, 302 extend upward in FIG. 3, i.e., from the main body 303 toward the room 11. An angle θ marks the difference between the extending direction of the first and the second protruding portions 301, 302 and the surface of the main body 303. The angle θ can range between 90 and 180 degrees, and preferably lies between 120 and 150 degrees. The first protruding portion 301 has a first early-stage pressure-adjusting element 301a, which is a concave.

Figure 4A:
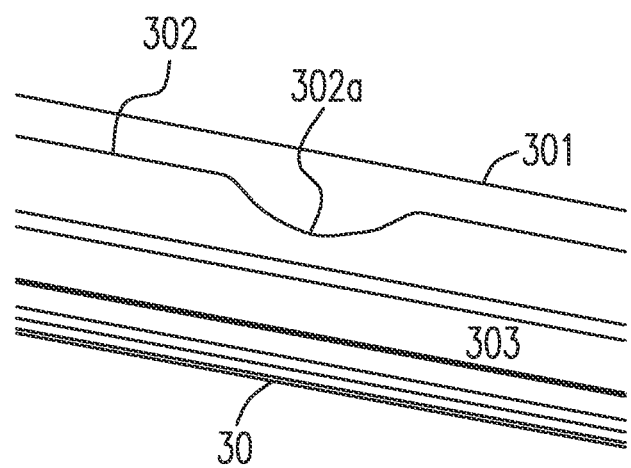
FIG. 4A shows an enlargement of portion B of the air-tight device in FIG. 2, according to the present invention.
Figure 4B:
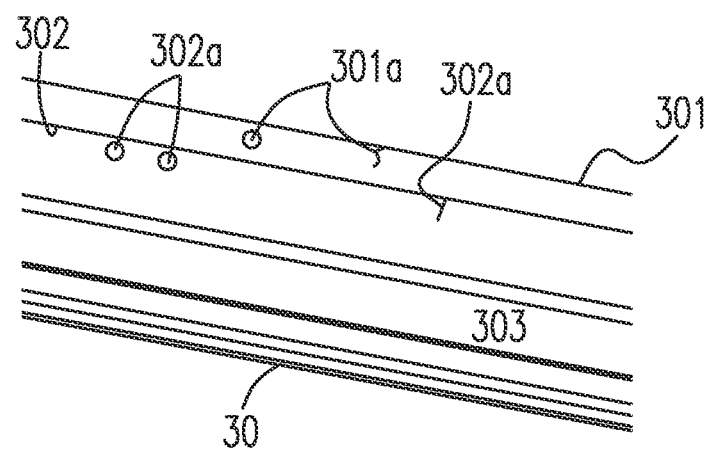
FIG. 4B is a schematic diagram showing other embodiments of the early-stage pressure-adjusting element according to the present invention.
Figure 4C:
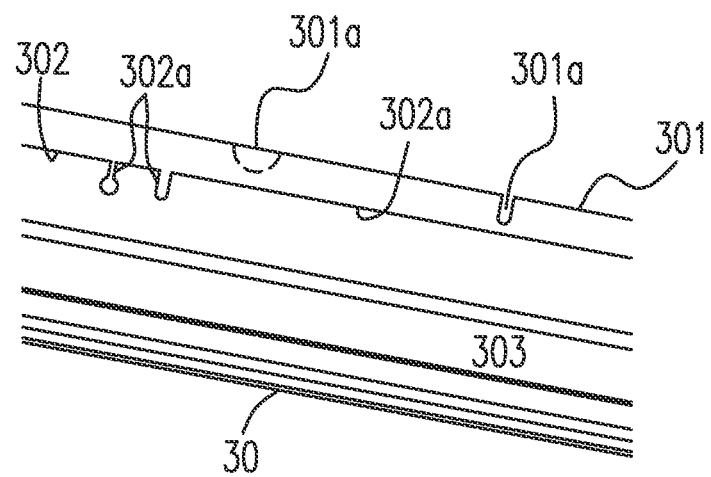
FIG. 4C is a schematic diagram showing still other embodiments of the early-stage pressure-adjusting element according to the present invention.

Please refer to FIG. 4A, which is an enlargement of portion B of the air-tight device 30 in FIG. 2. In FIG. 4A, a second early-stage pressure-adjusting element 302a, which is also a concave, is disposed on the second protruding portion 302. The early-stage pressure-adjusting elements 301a, 302a are configured to exhaust the first gas from the room 11 by pumping the second gas into the room 11 when the door 20 is closed. Referring to FIGS. 4B and 4C, the early-stage pressure-adjusting elements 301a, 302a can be configured differently, such as grooves, seams, through-holes, tunnels, or any combination thereof, and are preferably disposed near the edges of the first and the second protruding portions 301, 302. According to other embodiments of the present invention, a plurality of the early-stage pressure-adjusting elements 301a, 302a can be disposed on the first and the second protruding portions 301, 302, respectively. Furthermore, the aforementioned embodiments merely show the case of two protruding portions 301, 302 disposed on the air-tight device 30. There may be three or more protruding portions in the protruding part of the air-tight device 30. In principle, the more protruding portions, the better the air-tight effect.

Figure 5:
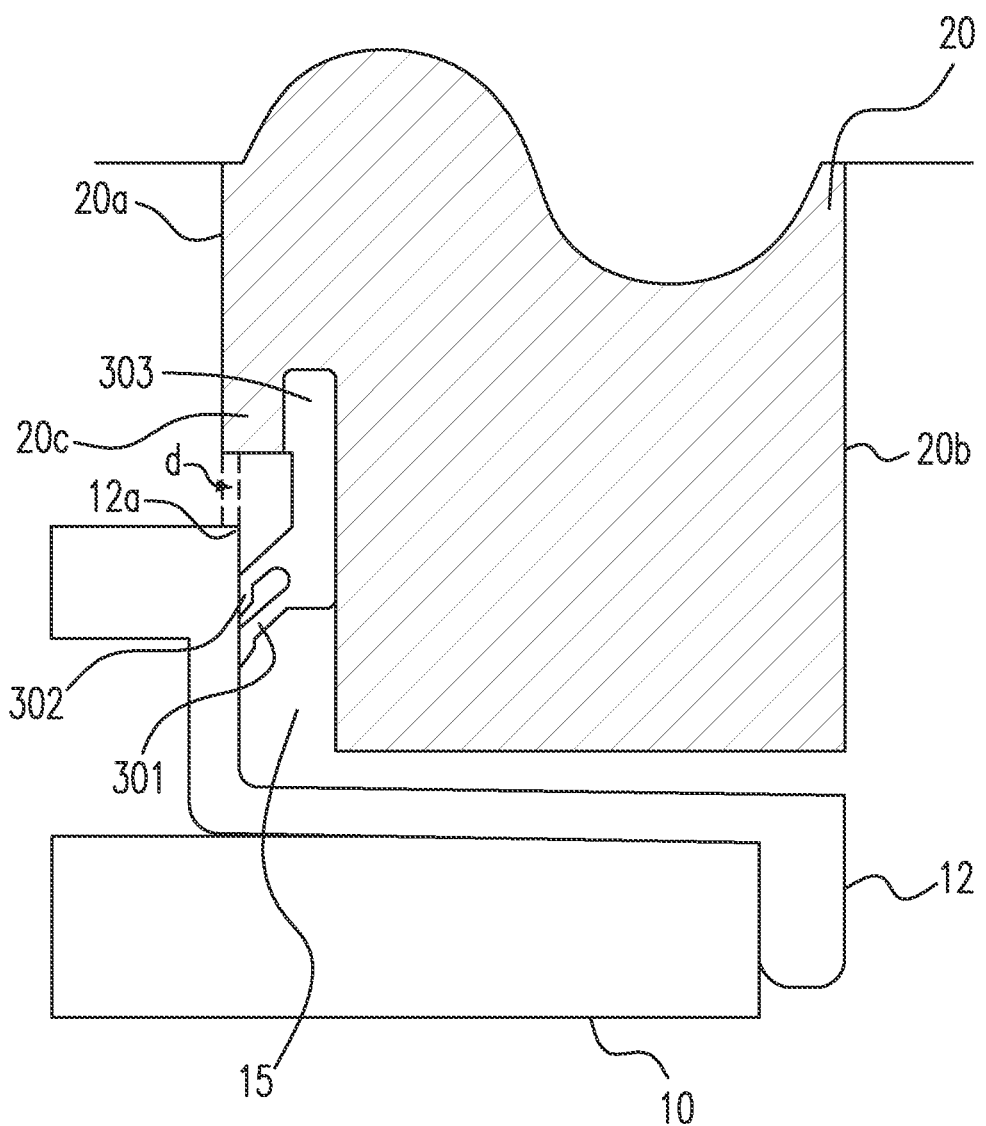
FIG. 5 shows an enlargement of portion C of the wafer container in FIG. 1 before a purging process.

Please refer to FIG. 5, which shows an enlargement of portion C of the wafer container 1 in FIG. 1, wherein the door 20 is closed and no purging process occurs. In FIG. 5, the air-tight device 30 is disposed in the gap 15 between the door 20 and the door frame 12. In other words, the air-tight device 30 is configured to prevent air flow from the room to the ambient environment and vice versa. When the door 20 is closed, the air-tight device 30 is deformed due to squeezed against the door frame 12. The first and second protruding portions 301, 302 firmly contact the door frame 12, and the inward surface 20a of the door 20 lies a distance d from the corner 12a of the door frame 12 in the direction of the room 11.

Figure 6:
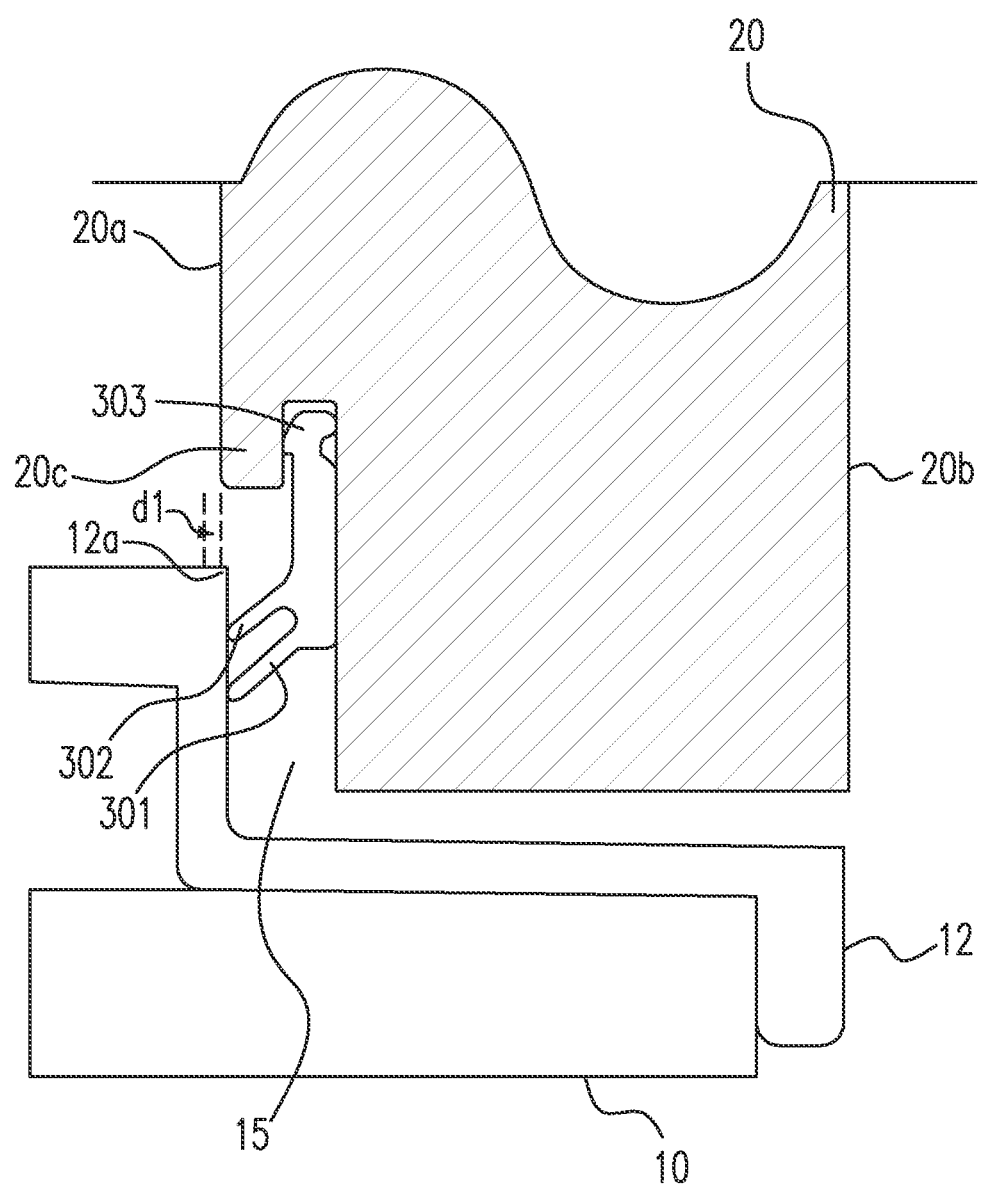
FIG. 6 shows an enlargement of portion C of the wafer container in FIG. 1 when the second gas is pumped into the container with a purging pressure.

Please refer to FIG. 6, which shows an enlargement of portion C of the wafer container 1 in FIG. 1, wherein the door 20 is closed and the second gas is being pumped into the room 11 with a purging pressure. The inward surface 20a of the door 20 is displaced outwardly with respect to the room 11 a distance d1 due to the purging pressure. The first and the second protruding portions 301, 302 more loosely contact the wall of the door frame 12 due to the outward displacement of the door 20 at the distance d1. Consequently, the first gas inside the room 11 can be exhausted from the early-stage pressure-adjusting elements 301a, 302a (not shown) disposed on the first and the second protruding portions 301, 302, helping pre-adjust the pressure inside the wafer container 1, and expediting the purging process.

Figure 7:
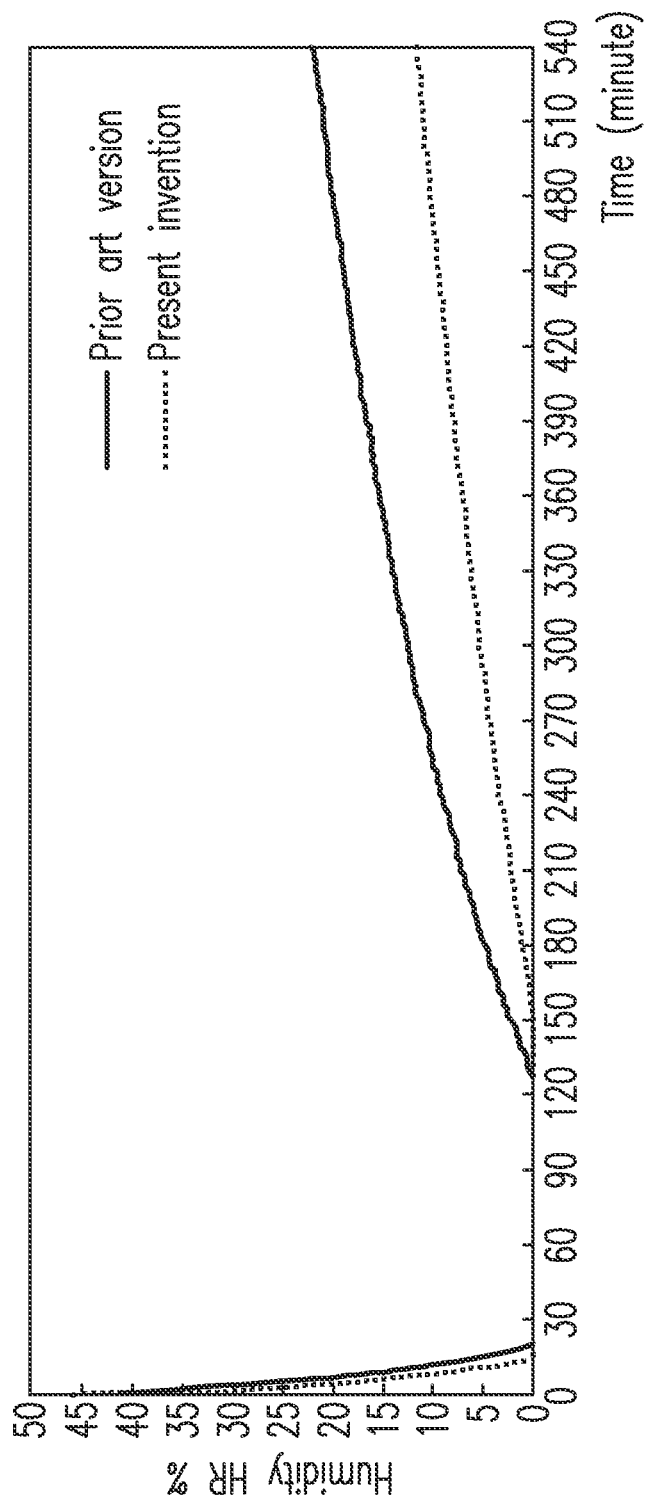
FIG. 7 is a chart comparing the efficacy of the air-tight device based on the present invention versus the prior art.

Please refer to FIG. 7, which is a chart comparing the performance of an air-tight device 30 based on the present invention with an air-tight plastic strip known in the art, when the one wafer container is equipped with the air-tight device 30 and the other wafer container with a traditional type of air-tight plastic strip. The air-tight device 30 of the present invention significantly outperforms the prior art, particularly on the purging period during the first few minutes and the air-tight effect after two hours (i.e., 120 minutes) of storage. After a purging process suddenly reduces the relative humidity inside the container, the air-tight device 30 of the present invention maintains relative humidity at lower as well as stable levels. Therefore, the air-tight device 30 according to the present invention renders the purging function and the air-tight function of the wafer container much better than those of the prior art.

Figure 8:
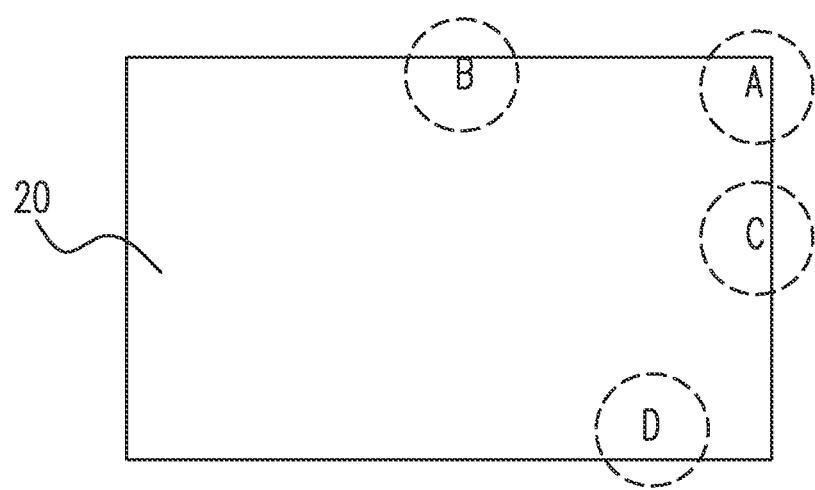
FIG. 8 is a schematic diagram showing the measured locations at the door when performing the pumping test.
Figure 9:
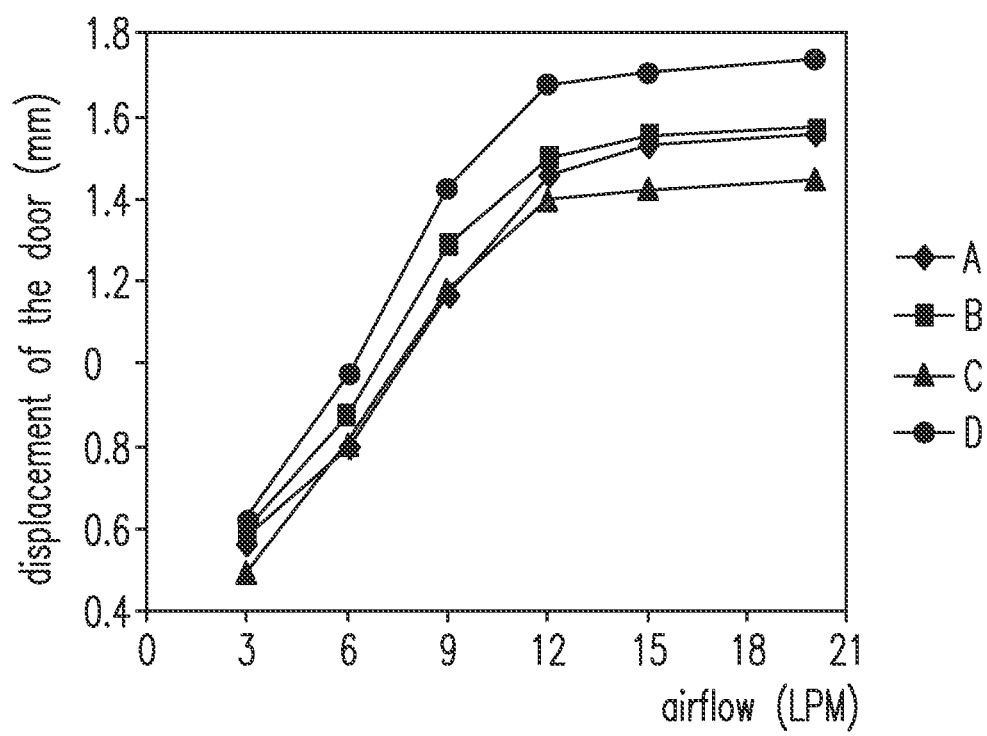
FIG. 9 shows the relation between the pumping air flow and the displacement of the door.

To inspect the actual displacement of the door 20 of the present invention under the pumping pressure, a plurality of sensors (laser movement meter) are utilized to measure the displacement along the outward direction with respect to the room 11. Locations A to D at which the measurements are taken are shown in FIG. 8. The relations between the pumping air flow (liter per minute, LPM) and the displacement (millimeter, mm) of the door 20 at the tested locations A to D are illustrated in FIG. 9. As the pumped air flow increases, the displacement increases. Data collection according to FIG. 9 is shown in Table 1. It is observed that the displacement of the door 20 is about 0.5 mm under a lower pressure when the air flow is as low as 3 LPM, and the displacement is always less than 2 mm no matter how large the air flow is.

TABLE 1

| Air Flow | Location | | | |
|---|---|---|---|---|
| | A | B | C | D |
| 3 | 0.57 | 0.59 | 0.5 | 0.62 |
| 6 | 0.8 | 0.88 | 0.81 | 0.98 |
| 9 | 1.17 | 1.29 | 1.18 | 1.43 |
| 12 | 1.46 | 1.5 | 1.4 | 1.68 |
| 15 | 1.53 | 1.55 | 1.43 | 1.71 |
| 20 | 1.56 | 1.57 | 1.45 | 1.74 |

Figure 10:
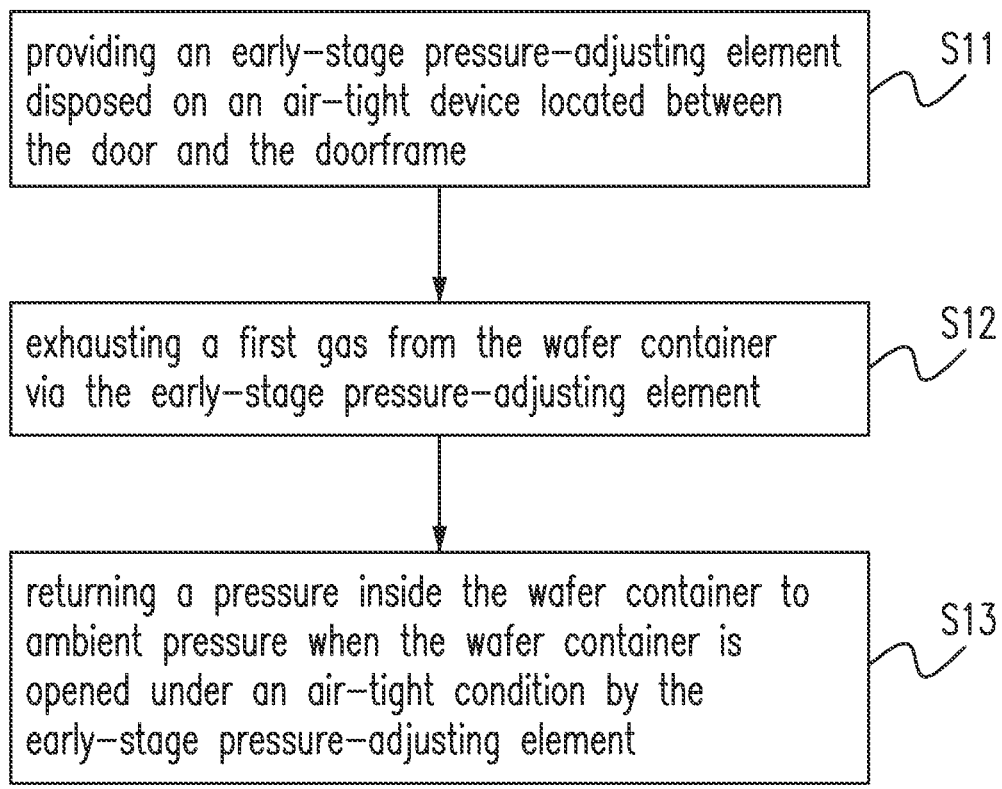
FIG. 10 is a schematic flow chart shows the steps of the method according to present invention.

From a different point of view, according to the present invention, the method for operating a wafer container having a door frame and a door fitting in the door frame includes the steps as shown in FIG. 10. In Step S11, providing an early-stage pressure-adjusting element disposed on an air-tight device located between the door and the door frame. In Step S12, exhausting a first gas from the wafer container via the early-stage pressure-adjusting element. In Step S13, returning a pressure inside the wafer container to ambient pressure when the wafer contained is opened under an air-tight condition by the early-stage pressure-adjusting element. The door is designed to allow a wafer to pass through, and the early-stage pressure-adjusting element includes at least one selected from a group consisting of a concave, a through-hole, a seam, a tunnel, a groove and a combination thereof.

The present invention expedites the adjustment of air pressure when the container encounters a pressure-change condition, such as purging process or door opening, with the aid of one or more early-stage pressure-adjusting elements disposed on the air-tight device of the door. The present invention also helps maintain the air-tight condition when a plurality of protruding portions are disposed in the air-tight device of the door.

Embodiments:

Embodiment 1

A wafer container, comprising: a housing, having a room with an opening formed therein, and a door frame surrounding the opening; a door fitting in the door frame to close the opening; and an air-tight device disposed around the door, located between the door and the door frame, and having a protruding part extending toward the room, wherein the protruding part has an early-stage pressure-adjusting element configured to exhaust a first gas from the room by pumping a second gas into the room when the door is closed.

Embodiment 2

The wafer container of Embodiment 1, wherein the early-stage pressure-adjusting element includes at least one selected from the group consisting of a concave, a through-hole, a seam, a tunnel, a groove and a combination thereof.

Embodiment 3

The wafer container of Embodiments 1 and 2, further comprising an exhaust valve disposed on the housing and configured to exhaust the first gas from the room.

Embodiment 4

The wafer container of Embodiments 1 to 3, further comprising a pumping valve disposed on the housing and configured to pump the second gas into the room.

Embodiment 5

The wafer container of Embodiment 4, wherein the second gas includes one selected from the group consisting of nitrogen, an inert gas and a clean dry air.

Embodiment 6

The wafer container of Embodiments 1 to 5, wherein the protruding part comprises a first protruding portion having a first early-stage pressure-adjusting element and a second protruding portion having a second early-stage pressure-adjusting element, and the second protruding portion is disposed more inward than the first protruding portion with respect to the room of the wafer container.

Embodiment 7

The wafer container of Embodiments 1 to 6, wherein the air-tight device includes a material selected from the group consisting of a polyamide, a styrene, a polyolefin, a polyurethane and a rubber.

Embodiment 8

The wafer container of Embodiments 1 to 7, wherein the door is designed to allow a wafer to pass through.

Embodiment 9

A wafer container, comprising: a door frame; a door, fitted in the door frame; an air-tight device, disposed between the door and the door frame; and an early-stage pressure-adjusting element, disposed on the air-tight device for pre-adjusting a pressure inside the wafer container.

Embodiment 10

The wafer container of Embodiment 9, wherein the air-tight device has a protruding part; the early-stage pressure-adjusting element is disposed on the protruding part; and the early-stage pressure-adjusting element includes at least one selected from a group consisting of a concave, a through-hole, a seam, a tunnel, a groove and a combination thereof.

Embodiment 11

The wafer container of Embodiment 10, wherein the protruding part comprises a first protruding portion having a first early-stage pressure-adjusting element and a second protruding portion having a second early-stage pressure-adjusting element; and the second protruding portion is disposed more inward than the first protruding portion with respect to the room of the wafer container.

Embodiment 12

The wafer container of Embodiments 9 to 11, further comprising an exhaust valve configured to exhaust a first gas from the wafer container.

Embodiment 13

The wafer container of Embodiments 9 to 12, further comprising a pumping valve configured to pump a second gas into the wafer container.

Embodiment 14

The wafer container of Embodiments 9 to 13, wherein the second gas includes one selected from a group consisting of nitrogen, an inert gas and a clean dry air.

Embodiment 15

The wafer container of Embodiments 9 to 14, wherein the air-tight device includes a material selected from a group consisting of a polyamide, a styrene, a polyolefin, a polyurethane and a rubber.

Embodiment 16

The wafer container of Embodiments 9 to 15, wherein the door is to allow a wafer to pass through.

Embodiment 17

A method for operating a wafer container having a door frame and a door fitting in the door frame, the method comprising steps of: providing an early-stage pressure-adjusting element disposed on an air-tight device located between the door and the door frame; and exhausting a first gas from the wafer container via the early-stage pressure-adjusting element.

Embodiment 18

The method of Embodiment 17, wherein the door is designed to allow a wafer to pass through; and the early-stage pressure-adjusting element includes at least one selected from a group consisting of a concave, a through-hole, a seam, a tunnel, a groove and a combination thereof.

Embodiment 19

The method of Embodiments 17 and 18, further comprising a step of returning a pressure inside the wafer container to ambient pressure when the wafer container is opened under an air-tight condition by the early-stage pressure-adjusting element.

Embodiment 20

The method of Embodiments 17 to 19, wherein the wafer container has an exhaust valve configured to exhaust the first gas from the wafer container and a pumping valve configured to pump a second gas from the wafer container.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A wafer container, comprising:
a housing having a room with an opening formed therein, and a door frame having a wall surrounding the opening;
a door fitting in the door frame to close the opening and having an inward surface; and
an air-tight device disposed around the door, located between the door and the door frame, and having a protruding part extending toward the room, wherein the protruding part has a first protruding portion, a second protruding portion and an early-stage pressure-adjusting element configured to exhaust a first gas from the room by pumping a second gas into the room when the door is closed to have an outward displacement, the second gas is pumped into the room with a purging pressure, the inward surface of the door is displaced outwardly with respect to the room a distance due to the purging pressure, the first protruding portion and the second protruding portion loosely contact the wall of the door frame due to the outward displacement of the door.

2. The wafer container as claimed in claim 1, wherein the early-stage pressure-adjusting element includes at least one selected from the group consisting of a concave, a through-hole, a seam, a tunnel, a groove and any combination thereof.

3. The wafer container as claimed in claim 1, further comprising:
an exhaust valve disposed on the housing, and configured to exhaust the first gas from the room.

4. The wafer container as claimed in claim 1, further comprising:
a pumping valve disposed on the housing, and configured to pump the second gas into the room.

5. The wafer container as claimed in claim 4, wherein the second gas includes one selected from the group consisting of nitrogen, an inert gas and a clean dry air.

6. The wafer container as claimed in claim 1, wherein the first protruding portion has a first early-stage pressure-adjusting element and the second protruding portion has a second early-stage pressure-adjusting element, and the second protruding portion is disposed more inward than the first protruding portion with respect to the room of the wafer container.

7. The wafer container as claimed in claim 1, wherein the air-tight device includes a material selected from the group consisting of a polyamide, a styrene, a polyolefin, a polyurethane and a rubber.

8. The wafer container as claimed in claim 1, wherein the door is designed to allow a wafer to pass through.

9. A wafer container having a room, comprising:
a door frame having a wall;
a door fitted in the door frame and having an inward surface;
an air-tight device having a protruding part, and disposed between the door and the door frame; and
an early-stage pressure-adjusting element disposed on the air-tight device for pre-adjusting a pressure inside the wafer container, and configured to exhaust a first gas from the room by pumping a second gas into the room when the door is closed to have an outward displacement, wherein the second gas is pumped into the room with a purging pressure, the inward surface of the door is displaced outwardly with respect to the room a distance due to the purging pressure, and the protruding part loosely contacts the wall of the door frame due to the outward displacement of the door.

10. The wafer container as claimed in claim 9, wherein the early-stage pressure-adjusting element is disposed on the protruding part, and the early-stage pressure-adjusting element includes at least one selected from a group consisting of a concave portion, a through-hole, a seam, a tunnel, a groove and a combination thereof.

11. The wafer container as claimed in claim 10, wherein the protruding part comprises a first protruding portion having a first early-stage pressure-adjusting element and a second protruding portion having a second early-stage pressure-adjusting element, and the second protruding portion is disposed more inward than the first protruding portion with respect to the room of the wafer container.

12. The wafer container as claimed in claim 9, further comprising:
an exhaust valve configured to exhaust the first gas from the wafer container.

13. The wafer container as claimed in claim 9, further comprising:
a pumping valve configured to pump the second gas into the wafer container.

14. The wafer container as claimed in claim 13, wherein the second gas includes one selected from a group consisting of nitrogen, an inert gas and a clean dry air.

15. The wafer container as claimed in claim 9, wherein the air-tight device includes a material selected from a group consisting of a polyamide, a styrene, a polyolefin, a polyurethane and a rubber.

16. The wafer container as claimed in claim 9, wherein the door is to allow a wafer to pass through.

* * * * *